Figure 1:
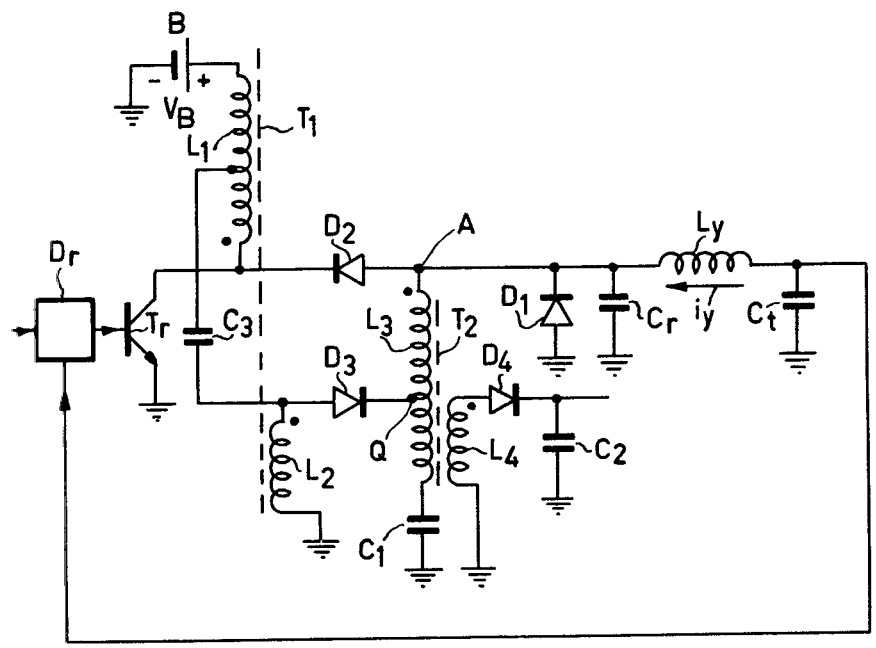

United States Patent [19]
Joosten et al.

[11] 3,950,674
[45] Apr. 13, 1976

[54] CIRCUIT ARRANGEMENT FOR GENERATING A SAWTOOTH DEFLECTION CURRENT THROUGH A LINE DEFLECTION COIL

[75] Inventors: Louis Geradus Josephus Joosten; Oswald Johannes Verbeij, both of Eindhoven, Netherlands

[73] Assignee: U.S. Philips Corporation, New York, N.Y.

[22] Filed: July 1, 1974

[21] Appl. No.: 484,586

[30] Foreign Application Priority Data
July 23, 1973 Netherlands ................. 7310198

[52] U.S. Cl. ............... 315/389; 315/407; 315/408
[51] Int. Cl.² ................. H01J 29/70; H01J 29/72
[58] Field of Search .............. 315/399, 405–411, 315/389

[56] References Cited
OTHER PUBLICATIONS

Wessel, A New Horizontal Output Deflection CKT, IEEE Transact. on Broadcast and TV Rec., Aug., 1972, BTR–18, No. 3, pp. 177–182.

*Primary Examiner*—T. H. Tubbesing
*Assistant Examiner*—T. M. Blum
*Attorney, Agent, or Firm*—Frank R. Trifari; Henry I. Steckler

[57] ABSTRACT

Circuit arrangement for combined line deflection and supply voltage stabilisation. The switched-mode transformer is connected via the secondary diode to a tapping on a winding coupled with the high-voltage winding. As a result, the maximum collector voltage is reduced and a greater range of supply voltage variations can be accommodated. All the windings may be wound on the same core.

5 Claims, 5 Drawing Figures

CIRCUIT ARRANGEMENT FOR GENERATING A SAWTOOTH DEFLECTION CURRENT THROUGH A LINE DEFLECTION COIL

The invention relates to a circuit arrangement for generating a sawtooth deflection current through a line deflection coil in an image display apparatus, which circuit arrangement comprises a deflection network including the deflection coil, a trace capacitor and a retrace capacitor and a first diode through which the deflection current flows during part of the trace interval whilst during the remainder of the trace interval this current flows through a second diode and a controllable switch, which switch and which second diode are connected in parallel with the first diode, the circuit arrangement further comprising an inductive element which is connected to the switch and is coupled to the deflection network via a third diode, and a transformer which has a core of a magnetic material and a winding of which is coupled, in series with a capacitor, to the deflection network.

Such a circuit arrangement is described in "IEEE Transactions on Broadcast and Television Receivers," August 1972, volume BTR-18, Nr. 3, pages 177 to 182, and is a combination of a line deflection circuit and a switched-mode supply voltage stabilizing circuit, the controllable switch being used to perform both the said functions. This known circuit arrangement has the advantage that it can be fed with an unstabilised supply voltage and is capable of supplying a satisfactorily stabilized deflection current, a stabilized high voltage and, if desired, auxiliary voltages, the stabilization being obtained by control of the conduction time of the swtich.

When such a circuit arrangement is to be designed, amongst other problems the three following ones arise. Firstly care must be taken to ensure that the maximum voltage set up across the switch (a transistor) during the retrace interval does not exceed the permissible limit value for this element. Secondly the variation of the conduction time of the transistor must be capable of accommodating the supply voltage variations to be expected. Thirdly the (stabilized) trace capacitor voltage applied to the deflection coil during the trace interval must be selectable at will, for with a given deflection coil this voltage determines the intensity of the deflection current produced.

The said problems are not independent of one another. If, for example, the trace voltage is low, the maximum collector voltage of the transistor also is low; it may be further reduced by making the conduction time of the transistor as short as possible. It will therefore be clear that several degrees of freedom are required. One degree of freedom is available to a certain extent, namely the transformation ratio between two windings of the inductive element, one winding being connected between a terminal of the supply voltage source and the junction point of the collector and the second diode, whilst the other winding, which is coupled to the first one, is connected to the third diode, for the choice of the said ratio enables a freer choice of the trace voltage. However, the two other problems, specifically that of maximum collector voltage, are not solved thereby.

It is an object of the present invention to provide a circuit arrangement having one more degree of freedom, permitting the maximum permissible collector voltage to be freely determined, and for this purpose the circuit arrangement according to the invention is characterized in that the inductive element is connected via the third diode to the series combination of the abovementioned series capacitor and part of the transformer winding.

The introduction of a new parameter not only enables the maximum collector voltage to be reduced without the trace voltage being affected but also proves to enable a larger range of supply voltage variations to be accommodated. Hence, the step according to the invention permits of designing a circuit arrangement in which conflicting requirements can simultaneously be satisfied.

In a possible embodiment in which the inductive element has a winding the circuit arrangement is characterized in that the winding of the inductive element is wound on the transformer core.

Figure 2:
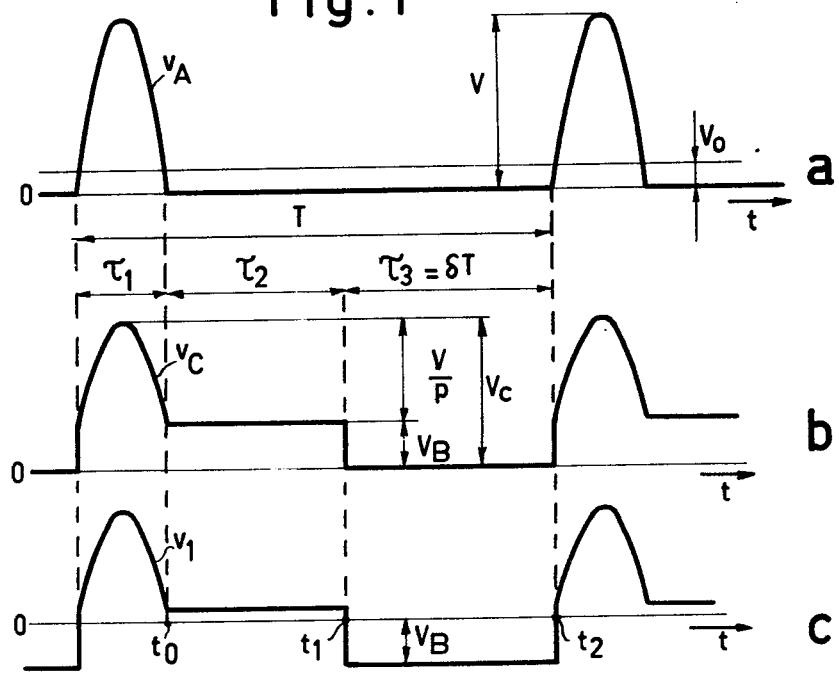
Figure 3A:
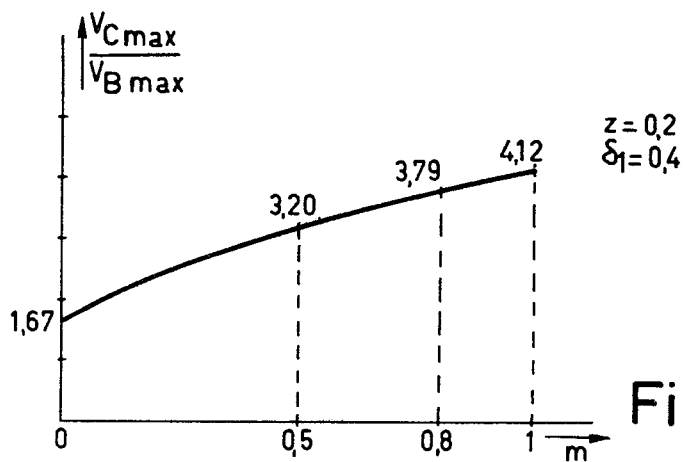
Figure 3B:
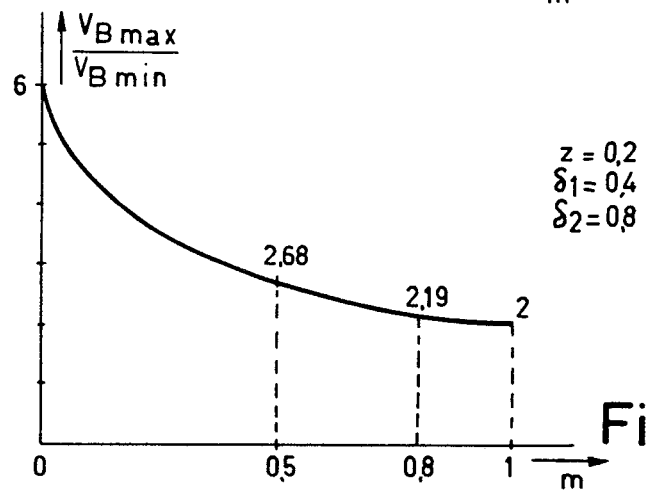
Figure 4:
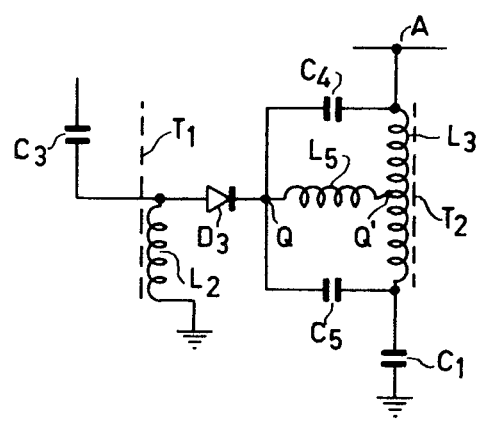

Embodiments of the invention will now be described, by way of example, with reference to the accompanying diagrammatic drawings, in which FIG. 1 is a circuit diagram showing schematically the basic elements of an embodiment of the circuit arrangement according to the invention, FIG. 2 shows waveforms of voltages produced in said embodiment, FIGS. 3a and 3b show graphs which may be used in the selection of the parameters, and FIG. 4 is a circuit diagram of a modified part of the circuit arrangement of FIG. 1.

The circuit arrangement shown in FIG. 1 includes a driver stage Dr to which signals from a line oscillator, not shown, are applied and which delivers switching pulses to the base of a switching transistor Tr. One end of a primary winding $L_1$ of a transformer $T_1$ is connected to the collector of the transistor Tr, which is of the n-p-n type, the other end of the winding $L_1$ being connected to the positive terminal of a direct-voltage source B to the negative terminal of which the emitter of the transistor Tr is connected. This negative terminal may be connected to the earth of the circuit arrangement.

A trace capacitor $C_t$ is connected in series with a line deflection coil $L_y$ of the image display apparatus, not shown further, of which the circuit arrangement of FIG. 1 forms part, the resulting series combination being shunted by a diode $D_1$ having the conductive direction shown and by a retrace capacitor $C_r$. The capacitor $C_r$ may alternatively be connected in parallel with the coil $L_y$. The said four elements represent the schematic circuit diagram including the basic elements of the deflection section only. This section may, for example, in known manner be provided with one or more transformers for mutual coupling of the elements, with devices for centering and linearity correction and the like.

A secondary winding $L_2$ of the transformer $T_1$ is connected to the anode of a diode $D_3$, and the anode of a diode $D_2$ is connected to the junction point $A$ of the elements $D_1$, $C_r$ and $L_y$. The cathode of the diode $D_2$ is connected to the collector of the transistor $T_r$ whilst the cathode of the diode $D_3$ is connected to a tapping $Q$ on a winding $L_3$ of a transformer $T_2$. One end of the winding $L_3$ is connected to the point $A$, the other end being connected to earth via a capacitor $C_1$. The core of the transformer $T_2$ carries further windings across which voltages are produced which serve as supply voltages for other components of the image display apparatus.

FIG. 1 shows one of said windings, the windings $L_4$, which by means of a rectifier $D_4$ produces a positive direct voltage across a smoothing capacitance $C_2$. One of said windings, for example the winding $L_4$, is the high voltage winding, so that the voltage set up across the capacitor $C_2$ is the high voltage for the final accelerating anode of the display tube (not shown). The free ends of the windings $L_2$ and $L_4$ are connected to earth, and the winding senses of the windings shown are indicated in the Figure by polarity dots.

The operation of the circuit arrangement is similar to that described in the abovementioned paper and may be summarized as follows. During a first part of the line trace interval the diode $D_1$ is conducting. The voltage across the capacitor $C_t$ is applied to the deflection coil $L_y$ through which a sawtooth deflection current $i_y$ flows. At a given instant the transistor TR becomes conducting. When in about the middle of the trace interval the current $i_y$ reverses direction the diode $D_1$ is cut off, so that the current $i_y$ then flows through the diode $D_2$ and the transistor Tr. At the end of the trace interval the transistor Tr is cut off. As a result an oscillation, the retrace pulse, is produced across the capacitor $C_r$ whilst the energy derived from the source $B$ and stored in the winding $L_1$ causes a current to flow through the diode $D_3$. When the voltage across the capacitor $C_r$ has become zero again, the diode $D_1$ becomes conducting: this is the beginning of a new trace interval. The diode $D_3$ remains conducting until the transistor Tr is rendered conducting, the energy stored in the winding $L_2$ being transferred to the winding $L_1$. Stabilisation is provided, for example, by feeding back the voltage across the capacitor $C_t$ to the driver circuit Dr, in which a comparison stage and a modulator ensure that the conduction time of the transistor Tr is varied so that the said voltage and hence the amplitude of the deflection current remain constant. Compared with the known case in which the cathode of the diode $D_3$ is connected to the point $A$ instead of to the tapping $Q$ operation is different, the difference being as follows. In the known case the current passed by the diode $D_3$ flows to earth via the diode $D_1$ during the first part of the trace interval. In the arrangement shown in FIG. 1, during this same part energy is stored in the series combination $L_3$, $C_1$. The voltage $v_A$ across the capacitor $C_r$, the voltage $v_c$ at the collector of the transistor $T_r$ and the voltage $v_1$ across the winding $L_1$ are plotted against time in FIGS. 2a, 2b and 2c respectively. The symbol $T$ indicates the line period, $\tau_1$ indicates the retrace interval, $\tau_2$ that part of the period $T$ in which the transistor Tr is non-conducting, and $\tau_3 = \delta T$ indicates the part of the period $T$ in which this transistor is conducting. The number $\delta$ is the ratio between the time $\tau_3$ and the period $T$.

The voltage $v_A$ consists of the retrace pulse of amplitude $V$ during the time $\tau_1$ and is zero during the time $\tau_2$. At the instant at which the transistor Tr is rendered conducting, i.e. the instant of transition $t_1$ between $\tau_2$ and $\tau_3$, the voltage $v_C$ becomes substantially zero. Thus the voltage $V_B$ of the source $B$ is set up across the winding $L_1$.

In the circuit arrangement of FIG. 1 two ratios are significant, namely the transformation ratio between the windings $L_1$ and $L_2$, i.e. the ratio between the number of turns of the winding $L_1$ and that of the winding $L_2$, which is equal to 1 : $p$, and the ratio of the turns number of the entire winding $L_3$ and that of the part of this winding between the tapping Q and the end connected to the capacitor $C_1$, which ratio is 1 : $m$. First it will be assumed that the points Q and A coincide ($m = 1$).

During the time $\tau_3$ the voltage across the winding $L_2$ is equal to $-pV_B$. During the time $\tau_1$ the voltage $v_c$ is equal to $V/p + V_B$. Let $V_o$ be the direct voltage across the capacitor $C_t$, if the capacitance of this capacitor is large enough, or the direct voltage component of the voltage across this capacitor, if it has a comparatively small capacitance for the purpose of the $S$ correction; in either case it is equal to the mean value of the voltage $v_A$, for no direct-voltage component can be set up across the coil $L_y$. The capacitor $C_1$ has a large capacitance, so that a direct voltage equal to $V_o$ is set up across it. The following equation applies:

$$V_o = \frac{1}{T}\int_0^{\tau_1} v_A \, dt.$$

The mean value of the voltage across the winding $L_3$ also is zero, so that the equation applies:

$$\int_0^{\tau_1} v \, dt - pV_B \cdot \tau_3 = 0$$

In this formula the integral can be substituted, Yielding $$V_o T = pV_B \cdot \tau_3, \text{ that is: } V_o = p\delta \cdot V_B \qquad (1)$$

At given values of the ratios $\delta$ and $p$ the diode $D_2$ will conduct during the time $\tau_1$. Because during this time the diode $D_3$ is conducting, the windings $L_1$ and $L_2$ will be short-circuited by the diodes $D_2$ and $D_3$, causing the retrace pulse across the capacitor $C_r$ to be clipped and the deflection current to be distorted. U.S. Pat. Application No. 443,863 filed Feb. 19, 1974 describes steps for avoiding such an effect, for example by including in series with the diode $D_2$ a transistor which is cut off during the time $\tau_1$. A capacitor $C_3$ is connected between the ends of the windings $L_1$ and $L_2$ or between tappings thereon for the purpose of preventing the occurrence of parasitic oscillations which may be produced by the leakage inductance between the said windings in a manner such that no line-frequency voltage is set up across the capacitor $C_3$. FIG. 1 shows the case where $p < 1$.

The maximum value of the collector voltage $v_c$ of the transistor is equal to $$V_c = \frac{V}{p} + V_B = \frac{\alpha V_o}{p} + V_B = (\alpha \delta + 1) V_B,$$

where $\alpha$ is the ratio $V/V_o$ which depends upon the retrace ratio $Z = \tau 1/T$. The maximum value of $V_c$ is obtained when $V_B$ has its maximum value $V_{B\,max}$, for which $\delta$ has the value $\delta_{min}$, for from the relationship (1) it follows that $\delta$ and $V_B$ are inversely proportional to one another because the voltage $V_o$ is maintained constant.

The voltage $V_o$ can be chosen by choosing the ratio $p$, so that the deflection current $_y$ is determined for a given deflection coil $L_y$. However, from the above it follows that the maximum value of the voltage $V_c$, which is highly critical for the transistor, is not controllable. Moreover, the relationship (1) can be written:

$V_o = p \delta_{min} \cdot V_{B\ max} = p \delta_{max} \cdot V_{B\ min}$, where $V_{B\ min}$ is the minimum value of $V_B$ for which $\delta = \delta_{max}$, and from which follows:

$$\frac{V_{B\ max}}{V_{B\ min}} = \frac{\delta_{max}}{\delta_{min}}.$$

The ratio $\delta_{min}$ has its minimum value $\delta_1$ if the instant $t_1$ coincides with the middle of the trace interval, and $\delta_{max}$ has its maximum value $\delta_2$ if the instant $t_1$ coincides with the beginning $t_o$ of the trace interval. Hence the above ratio cannot exceed 2, so that the arrangement cannot accommodate larger variations of the voltage $V_B$.

According to the invention the points A and Q do not coincide. The voltage across the winding $L_3$ is equal to $v_A - V_o$ so that the voltage $v_Q$ in the point Q is equal to $v_Q = V_o + m(v_A - v_o) = mv_A + (1 - m)V_o$. With the aid of the waveform of the voltage $v_A$ of FIG. 2a the waveform of the voltage $v_1$ across the winding $L_1$ between the positive terminal of the source B and the collector of the transistor Tr can be plotted (FIG. 2c), allowing for the fact that the diode $D_3$ is conducting during the times $\tau_1$ and $\tau_2$.

Thus we have:

during time $\tau_1$: $v_1 = \frac{1}{p}[mv_A + (1 - m) V_o]$ during time $\tau_2$: $v_1 = \frac{1}{p}(1 - m) V_o$.

during time $\tau_3$: $v_1 = - V_B$. Writing the condition for the mean value of the voltage $v_1$ being zero after some calculations yields.

$$\frac{V_o}{p} = \frac{V_B}{\frac{1}{\delta} - (1 - m)} \qquad (2)$$

The maximum value of the collector voltage $v_c$ is $$V_{c\ max} = \frac{1}{p}[mV + (1 - m) V_o] + V_{B\ max}$$

from which follows:

$$\frac{V_{c\ max}}{V_{B\ max}} = \frac{\alpha m + \frac{1}{\delta_{min}}}{\frac{1}{\delta_{min}} - (1 - m)} \qquad (3)$$

after substitution of the formula (2). It can be shown that this function steadily decreases with decrease of the ratio $m$. It is plotted in FIG. 3a for $z = 0.2$, from which follows $\alpha \approx \pi/2z \approx 7,8$, and with $\delta_{min} = \delta_1 = \frac{1}{2}(1 - z) = 0.4$. The Figure shows that by making $m$ less than 1 a reduction of the maximum collector voltage is obtained and that this result is independent of the ratio $p$.

From the formula (2) the following relationship can be derived:

$$\frac{V_{B\ max}}{V_{B\ min}} = \frac{\frac{1}{\delta_{min}} - (1 - m)}{\frac{1}{\delta_{max}} - (1 - m)} \qquad (4)$$

$$\frac{V_{B\ max}}{V_{B\ min}} = \frac{\frac{1}{\delta_{min}} - (1 - m)}{\frac{1}{\delta_{max}} - (1 - m)} \qquad (4)$$

This function also is independent of the ratio $p$ and it increases as $m$ decreases. It is plotted in FIG. 3b for $\delta_{min} = \delta_1 = 0.4$ and $\delta_{max} = \delta_2 = 0.8$ ($Z = 0.2$), so that the entire $\delta$ range is used, whilst the Figure shows that a larger range of supply voltage variations can be accommodated, for when $m$ is less than 1 the ratio $V_{B\ max}/V_{B\ min}$ exceeds 2.

Similarly to the preceding case, the voltage $V_o$ can be determined by the choice of the ratio p. If the means described in the abovementioned U.S. Pat. Application No. 443,863 are to be dispensed with, it is found that an upper limit can be set to $p$. The diode $D_2$ will just be conducting during the time $\delta_1$ if the lowest value of the voltage $V_c$ which is found in practice, that is $$V_{c\ min} = \frac{1}{p}[mv + (1 - m) V_o] + V_{B\ min},$$

is equal to the voltage V. In the above expression, according to the formula (2), $$V_{B\ min} = \frac{V_o}{p}[1/\delta_{max} - (1 - m)],$$

from which we can derive:

$$p = p_{max} = m + \frac{1}{\alpha \delta_{max}} \qquad (5)$$

The above will be explained by means of two numerical examples. If the voltage $V_B$ can vary between 230 volts and 345 volts (with a mains voltage of 220 volts) $V_{B\ max}/V_{B\ min}$ is less than 2, so this does not provide difficulty. If the transistor Tr is not capable of withstanding a voltage exceeding 1200 volts, it will be seen from FIG. 3a that $m = 0.64$. From the formula (2) it follows that $$\frac{V_o}{p} = \frac{345}{2.5 - (1 - 0.64)} = 161 \text{ volts},$$

with $\delta_{min} = \delta_1$ and $$\frac{1}{\delta_{max}} = 1 - 0.64 + \frac{230}{161} = 1.79,$$

so that $\delta_{max} = 0.56 < \delta_2$. The formula (5) yields:

$$p_{max} = 0.64 + \frac{1.79}{7.8} = 0.87,$$

so that $V_o = 0.87$ times $161 = 140$ volts.

If now the voltage $V_B$ can vary between 115 volts and 345 volts (the mains voltage is 110 volts or 220 volts), then $V_{B\ max}/V_{B\ min} = 3$. FIG. 3b shows that $m = 0.38$, for which FIG. 3a yields $V_{c\,max} = 2.9$ times $345 = 1000$ volts. Formula (2) yields:

$$\frac{V_o}{p} = \frac{345}{2.5 - (1 - 0.38)} = 183 \text{ volts},$$

whilst $$P_{max} = 0.38 + \frac{1}{0.8 \text{ times } 7.8} = 0.54,$$

so that $V_o = 0.54$ times $183$ volts $= 99$ volts. Because $m$ cannot be increased, a higher $V_o$ if desired requires $p$ to exceed $0.54$, and hence the step according to the abovementiond Patent Application must be used.

Similarly to what is the case in U.S. Pat. Application No. 473,771, filed June 1, 1973, the cores of the transformers $T_1$ and $T_2$ of FIG. 1 may be one and the same core, that is to say the windings $L_1$, $L_2$ and the winding $L_3$ may be coupled to one another in spite of the fact that voltages of different waveforms are set up across the said windings. This is possible because the said voltage waveforms are not affected by the coupling, since the voltages $V_o$ and $V_B$ are "hard," that is to say they are externally impressed, and hence are not affected by the coupling. The currents flowing through the windings, however, are affected. In the lastmentioned Patent Application it is shown that the operation of the circuit arrangement is not adversely affected thereby, but on the contrary important advantages are obtained. It should be mentioned that instead of the tapping Q an additional winding may be wound on the same core as the winding $L_3$, which additional winding has a smaller number of turns than the winding $L_3$ and is included between the cathode of the diode $D_3$ and the junction point of $L_3$ and the capacitor $C_1$.

Formula (5) shows that the ratio $m$ should not be excessively small, because in this case the ratio $p$ also is small, with the result that large currents flow on the secondary side of the transformer $T_1$. In addition, large currents then will flow through the leakage inductance of the said transformer, which gives rise to ringing at the instant $t_1$. Furthermore difficulties will arise in designing the abovementioned embodiment using a single transformer. If for these reasons the formula (5) is not complied with, that is to say if $p$ is made greater than the preferred value $p_{max}$, the steps according to the abovementioned U.S. Pat. Application No. 443,863 have to be employed. This requires an additional transistor, which is expensive, or an additional diode, which does not prevent the production of a high $V_{c\,max}$, whilst it was the very purpose of using a low $m$ to obtain a low $V_{c\,max}$.

In practice there is a leakage inductance between the two parts of the winding $L_3$. In FIG. 4, which shows only part of the circuit arrangement, this leakage inductance is shown as an inductance $L_5$ between the point $Q$ and an imaginary tapping $Q'$ on the winding $L_3$. The inductance $L_5$ prevents abrupt current transistions which in conjunction with the stray capacitances may give rise to ringing. This can be avoided by connecting a capacitor $C_4$ between points A and $Q$ and a capacitor $C_5$ between the point $Q$ and the junction point of the winding $L_3$ and the capacitor $C_1$. If the ratio between the reactances of $C_4$ and $C_5$ is equal to that between the numbers of turns of the upper and lower parts of the winding $L_3$, no alternating voltage is set up across the inductance $L_5$, so that no ringing can occur. The parallel connection of the capacitor $C_r$ and of the network $C_4$, $C_5$ together with the inductive components of the circuit arrangement results in a resonant frequency the period of which is about equal to twice the time $\tau_1$.

Hereinbefore it has been assumed that the capacitance of the capacitor $C_1$ is sufficiently large to enable the voltage across it to be regarded as constant ($= V_o$). It should be mentioned that this is necessary only if one or more of the auxiliary voltages produced by means of windings of the transformer $T_2$ are obtained by means of trace rectification.

What is claimed is:

1. Circuit arrangement for generating a sawtooth deflection current flowing through a line deflection coil in an image display apparatus, which circuit arrangement comprises a deflection network including trace and retrace capacitor means coupling to said coil, and a first diode coupled to said retrace capacitor through which the deflection current flows during part of the trace interval, means for conveying the deflection current during the remainder of the trace interval including a second diode and a controllable switch coupled to said diode, said switch and second diode together being coupled in parallel with the first diode, the circuit arrangement further comprising an inductive element coupled to the switch, a third diode coupled to the deflection network and to said inductive element, a transformer having a core of a magnetic material and a winding, and a capacitor coupled to said winding and to the deflection network, characterized in that the inductive element is coupled via the third diode to the series combination of the above-mentioned series capacitor and part of the transformer winding less than all of said winding.

2. Circuit arrangement as claimed in claim 1, in which the inductive element comprises a winding, characterized in that the winding of the inductive element is wound on the transformer core.

3. Circuit arrangement as claimed in claim 1, characterized in that a first capacitor is coupled in parallel with the said part of the transformer winding and a second capacitor is coupled in parallel with the remainder of the winding, the ratio between the reactances of the said capacitors being equal to the ratio between the number of turns of the said parts of the winding.

4. Circuit arrangement as claimed in claim 1 in which the inductive element has a primary winding and a secondary winding which are coupled with one another, characterized in that the ratio of the number of turns of the secondary winding to that of the primary winding is substantially equal to $$m + \frac{1}{\alpha\,\delta_{max}},$$

where $m$ is the ratio of the turns number of the part of the transformer winding between the connection to the third diode and the series capacitor to the turns number of the entire winding, $\alpha$ is the ratio of the amplitude of the retrace voltage to the trace voltage, and $\delta_{max}$ is the value of that ratio of the conduction time of the switch to the line period which is associated with the maximum value of a voltage supply source which supplies energy to the circuit arrangement.

5. A circuit arrangement as claimed in claim 1 wherein said core has two limbs, a tapped transformer winding and at least one high-voltage winding wound on one limb, a primary winding and a secondary winding wound on the other limb, the ratio of the number of turns of the secondary winding to that of the primary winding being greater than the ratio of the number of turns of the part of the transformer winding between the tapping and an end adapted to be connected to a series capacitor to the number of turns of the entire winding and being less than 1.

* * * * *

UNITED STATES PATENT AND TRADEMARK OFFICE
CERTIFICATE OF CORRECTION

PATENT NO. : 3,950,674
DATED : April 13, 1976
INVENTOR(S) : LOUIS G. J. JOOSTEN ET AL It is certified that error appears in the above-identified patent and that said Letters Patent are hereby corrected as shown below:

IN THE TITLE PAGE change "Geradus" to -- Gerardus --;

col. 5, line 18, cancel "$(V_A - v_O)$" and insert -- $(V_A - V_O)$ --;

col. 6, lines 1-5, cancel the equation in its entirety;

line 9, cancel "(Z = 0.2)" and insert -- ($\underline{z}$ = 0.2) --;

Signed and Sealed this

Seventh Day of December 1976

[SEAL]

Attest:

RUTH C. MASON
*Attesting Officer*

C. MARSHALL DANN
*Commissioner of Patents and Trademarks*